United States Patent
Banappagol

(10) Patent No.: US 12,346,141 B2
(45) Date of Patent: Jul. 1, 2025

(54) LOW DROPOUT REGULATOR

(71) Applicant: Agile Analog Ltd, Cambridgeshire (GB)

(72) Inventor: Mallikarjun Banappagol, Cambridgeshire (GB)

(73) Assignee: Agile Analog Ltd (GB)

( * ) Notice: Subject to any disclaimer, the term of this patent is extended or adjusted under 35 U.S.C. 154(b) by 237 days.

(21) Appl. No.: 18/037,922

(22) PCT Filed: Nov. 26, 2021

(86) PCT No.: PCT/GB2021/053082
§ 371 (c)(1),
(2) Date: May 19, 2023

(87) PCT Pub. No.: WO2022/112785
PCT Pub. Date: Jun. 2, 2022

(65) Prior Publication Data
US 2024/0004410 A1    Jan. 4, 2024

(30) Foreign Application Priority Data
Nov. 26, 2020  (GB) ..................... 2018605

(51) Int. Cl.
*G05F 1/575*   (2006.01)
*G05F 1/565*   (2006.01)
(Continued)

(52) U.S. Cl.
CPC ............. *G05F 1/575* (2013.01); *G05F 1/565* (2013.01); *G05F 1/59* (2013.01); *G05F 3/262* (2013.01)

(58) Field of Classification Search
CPC . G05F 1/565; G05F 1/575; G05F 1/59; G05F 3/262
See application file for complete search history.

(56) References Cited

U.S. PATENT DOCUMENTS 6,518,737 B1 * 2/2003 Stanescu ................. G05F 1/575
                                                     323/280
7,728,569 B1 * 6/2010 Le ........................... G05F 1/575
                                                     323/280
(Continued)

FOREIGN PATENT DOCUMENTS

EP      3594772 A1    1/2020

OTHER PUBLICATIONS

Search Report for Application No. GB2018605.2, completed May 17, 2021, 4 pages.
(Continued)

*Primary Examiner* — Jue Zhang
*Assistant Examiner* — Lakaisha Jackson
(74) *Attorney, Agent, or Firm* — Barnes & Thornburg

(57) ABSTRACT

A low dropout regulator comprising: a supply voltage connection for receiving a supply voltage; a load voltage output connection for providing a load voltage to a load; load voltage output control circuitry comprising a pass transistor configured to regulate the load voltage based on a voltage at its gate region; adaptive biasing circuitry comprising: a biasing transistor configured to regulate the voltage provided to the gate region of the pass transistor based on a voltage provided to a gate region of the biasing transistor; and operational transconductance amplifier, OTA, circuitry comprising a first OTA transistor and a second OTA transistor, wherein a gate region of the first OTA transistor is arranged to receive a reference voltage and a gate region of the second OTA transistor is arranged to receive a voltage indicative of the load voltage; and adaptive compensation circuitry comprising: (i) a first compensation capacitor having a first electrode and a second electrode, (ii) a second compensation capacitor having a first electrode and a second electrode, and (iii) a first compensation transistor, wherein the second (Continued)

electrode of the first compensation capacitor is coupled to a first region of the first compensation transistor, and wherein the first electrode of the second compensation capacitor is coupled to both a second and a gate region of the first compensation transistor; wherein a first region of the second OTA transistor is coupled to: (i) the supply voltage connection, (ii) the first electrode of the first compensation capacitor, and (iii) the gate region of the biasing transistor; and wherein a second electrode of the second compensation capacitor is coupled to a first region of the biasing transistor.

20 Claims, 3 Drawing Sheets

(51) Int. Cl.
*G05F 1/59* (2006.01)
*G05F 3/26* (2006.01)

(56) References Cited

U.S. PATENT DOCUMENTS

| 8,154,263 | B1 | 4/2012 | Shi et al. |
| 8,169,203 | B1 | 5/2012 | Vemula |
| 9,665,111 | B2 | 5/2017 | Forejtek |
| 10,444,780 | B1 | 10/2019 | Cheng et al. |
| 2007/0018621 | A1 | 1/2007 | Mok et al. |
| 2007/0188228 | A1* | 8/2007 | Renous .............. G05F 1/575 330/253 |
| 2013/0147448 | A1* | 6/2013 | Kadanka .............. G05F 1/565 323/280 |
| 2014/0312867 | A1 | 10/2014 | Pulvirenti et al. |
| 2025/0038711 | A1* | 1/2025 | Lim .................. H03F 3/68 |

OTHER PUBLICATIONS

International Search Report and Written Opinion for Application No. PCT/GB2021/053082, dated Feb. 28, 2022, 16 pages.

* cited by examiner ved low
LOW DROPOUT REGULATOR

TECHNICAL FIELD

The present disclosure relates to the field of regulators, in particular, the present disclosure relates to the field of low dropout regulators.

BACKGROUND

Voltage regulators can be used to provide a more stable power supply voltage. For instance, a power source such as a battery may be connected to a load to power that load. Due to variations in properties of the power source and the load, a supply voltage provided to the load from the power source may vary. Examples of these properties which may vary include load impedance, temperature, voltage output from the battery etc, how long the two have been connected etc. For example, the output voltage from a battery when it is almost discharged may be half the output voltage from the battery when the battery is fully charged. Voltage regulators are designed to receive a supply voltage from the power source, and to provide a load voltage to the load, where that supply voltage is intended to be relatively constant over time. It would be advantageous to provide an improved low dropout regulator in which the load voltage from the regulator is more consistent than that of previous low dropout regulators, i.e. to provide better load voltage regulation.

SUMMARY

Aspects of the disclosure are set out in the independent claims and optional features are set out in the dependent claims. Aspects of the disclosure may be provided in conjunction with each other, and features of one aspect may be applied to other aspects.

In an aspect, there is provided a low dropout regulator comprising: a supply voltage connection for receiving a supply voltage; a load voltage output connection for providing a load voltage to a load; load voltage output control circuitry comprising a pass transistor configured to regulate the load voltage based on a voltage at its gate region; adaptive biasing circuitry comprising: a biasing transistor configured to regulate the voltage provided to the gate region of the pass transistor based on a voltage provided to a gate region of the biasing transistor; and operational transconductance amplifier, OTA, circuitry comprising a first OTA transistor and a second OTA transistor, wherein a gate region of the first OTA transistor is arranged to receive a reference voltage and a gate region of the second OTA transistor is arranged to receive a voltage indicative of the load voltage; and adaptive compensation circuitry comprising: (i) a first compensation capacitor having a first electrode and a second electrode, (ii) a second compensation capacitor having a first electrode and a second electrode, and (iii) a first compensation transistor, wherein the second electrode of the first compensation capacitor is coupled to a first region of the first compensation transistor, and wherein the first electrode of the second compensation capacitor is coupled to both a second and a gate region of the first compensation transistor. A first region of the second OTA transistor is coupled to: (i) the supply voltage connection, (ii) the first electrode of the first compensation capacitor, and (iii) the gate region of the biasing transistor. A second electrode of the second compensation capacitor is coupled to a first region of the biasing transistor.

Embodiments may enable the provision of improved low dropout regulators, as low dropout regulators of the present disclosure may have greater stability. That is, low dropout regulators of the present disclosure may enable an output pole (for the regulator transfer function) to be compensated (e.g. cancelled out) by a zero for the regulator. Low dropout regulators may be provided having good phase margins across all operating conditions. Split compensation capacitors may enable this increased stability and good phase margins without affecting the DC operating conditions of the regulator.

A first region of the pass transistor may be coupled to the supply voltage connection and a second region of the pass transistor may be coupled to the load voltage output connection. The regulator may further comprise sensing circuitry, wherein the sensing circuitry comprises a sense transistor having a gate region coupled to the gate region of the pass transistor and a first region coupled to the supply voltage connection. The sensing circuitry may comprise a first current mirror coupled to both the sense transistor and the adaptive compensation circuitry. The first current mirror may comprise a first mirroring transistor having a first region coupled to: (i) the first electrode of the second compensation capacitor, (ii) the gate region of the first compensation transistor, and (iii) the second region of the first compensation transistor. The first current mirror may comprise a first mirrored transistor. The second region of the sense transistor may be coupled to: (i) the first region of the first mirrored transistor, (ii) the gate region of the first mirrored transistor, and (iii) the gate region of the first mirroring transistor.

The adaptive compensation circuitry may comprise a second compensation transistor. The first region of the first compensation transistor may be coupled to the supply voltage connection via the second compensation transistor. A first region of the second compensation transistor may be coupled to the supply voltage connection and its second and gate regions are shorted and coupled to both the second electrode of the first compensation capacitor and the first region of the first compensation transistor. The adaptive compensation circuitry may further comprise a compensation resistor arranged between the second electrode of the second compensation capacitor and the first region of the biasing transistor.

The gate region of the pass transistor may be coupled to the supply voltage connection via one or more resistors. The first region of the biasing transistor may be coupled to the supply voltage connection via said one or more resistors. The regulator may further comprise a resistance transistor having a gate region coupled to the gate region of the pass transistor and first and second regions coupled to the supply voltage connection. At least one of the first and second regions may be coupled to the supply voltage connection via one of said one or more resistors. The gate and second regions of the resistance transistor may be shorted. The first region of the biasing transistor may be coupled to the second region of the resistance transistor.

The adaptive biasing circuitry may comprise a current buffer. The gate region of the biasing transistor may be coupled to the supply voltage connection, the first electrode of the first compensation capacitor and the first region of the second OTA transistor via the current buffer. The current buffer may comprise a first transistor having a first region coupled to: (i) the supply voltage connection, (ii) the first electrode of the first compensation capacitor, and (iii) the first region of the second OTA transistor, and a second region coupled to the gate region of the biasing transistor.

The current buffer may comprise a second transistor having a first region coupled to both the supply voltage connection and a first region of the first OTA transistor. The gate region of the first transistor of the current buffer may be coupled to the gate region of the second transistor of the current buffer. A second region of the second transistor of the current buffer may be coupled to a first electrode of a third compensation capacitor. A second electrode of the third compensation capacitor may be coupled to the load voltage output connection. The regulator may comprise a tail transistor. A second region of each of the first and second OTA regions may be coupled to a first region of the tail transistor. A gate region of the tail transistor may be arranged to receive a bias voltage.

The load voltage output connection may be coupled to: (i) a coupling port for connection of the regulator to a load, and (ii) a first electrode of an output capacitor. A second electrode of the output capacitor may be coupled to a reference voltage, such as ground. The regulator may comprise a second current mirror. The second current mirror may be coupled to the current buffer and the gate region of the biasing transistor. The second current mirror may also be coupled to the first electrode of the third compensation capacitor. The regulator may comprise a controlled current source arranged to couple the supply voltage connection to the first region of the first and second OTA transistors, the first electrode of the first compensation capacitor and the gate region of the biasing transistor. The controlled current source comprises: a first transistor having a first region coupled to the supply voltage connection and a second region coupled to the first region of the first OTA transistor; and a second transistor having a first region coupled to the supply voltage connection and a second region coupled to the first electrode of the compensation capacitor, the first region of the second OTA transistor and the gate region of the biasing transistor. A gate region of the first transistor of the controlled current source may be coupled to a gate region of the second transistor of the controlled current source.

In an aspect, there is provided an electrical circuit comprising a load and a low dropout regulator. The regulator is coupled to the load and configured to regulate a load voltage provided to the load. The regulator comprises: a voltage input connection for receiving a supply voltage; load voltage output circuitry comprising a pass transistor comprising a first region, a second region and a gate region, wherein the second region of the pass transistor is coupled to the load, and wherein the pass transistor is configured to regulate the load voltage provided to the load based on a voltage at its gate region; adaptive biasing circuitry comprising: a biasing transistor configured to regulate the voltage provided to the gate region of the pass transistor based on a voltage provided to a gate region of the biasing transistor; and operational transconductance amplifier, OTA, circuitry comprising a first OTA transistor and a second OTA transistor, wherein a gate region of the first OTA transistor is arranged to receive a reference voltage and a gate region of the second OTA transistor is arranged to receive a voltage indicative of the load voltage; and adaptive compensation circuitry comprising: (i) a first compensation capacitor having a first electrode and a second electrode, (ii) a second compensation capacitor having a first electrode and a second electrode, and (iii) a compensation transistor, wherein the second electrode of the first compensation capacitor is coupled to a first region of the compensation transistor, and wherein the first electrode of the second compensation capacitor is coupled to both a second region of the compensation transistor and a gate region of the compensation transistor. A first region of the second OTA transistor is coupled to: (i) the supply voltage connection, (ii) the first electrode of the first compensation capacitor, and (iii) the gate region of the biasing transistor. A second electrode of the second compensation capacitor is coupled to a first region of the biasing transistor.

FIGURES

Some examples of the present disclosure will now be described, by way of example only, with reference to the figures, in which.

In the drawings like reference numerals are used to indicate like elements.

Overview

Figure 1:
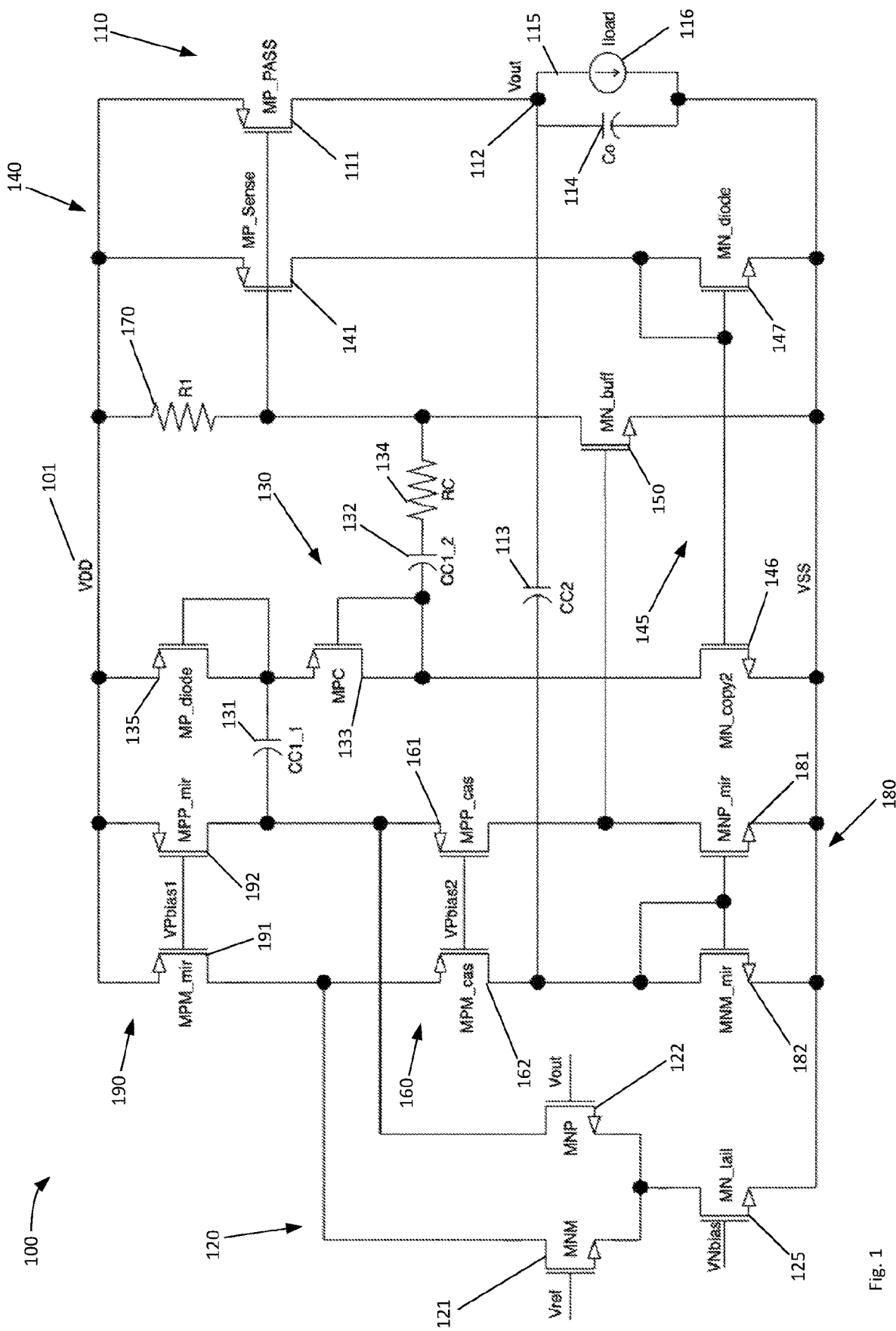
FIG. 1 shows a schematic circuit diagram for an exemplary low dropout regulator.

Disclosed herein are examples of low dropout regulators in which adaptive compensation circuitry is included to provide a variable time constant for operation of the regulator. The adaptive compensation circuitry comprises a first and second compensation capacitor which are split across a first compensation resistor. A first region of the first compensation transistor is coupled to the first compensation capacitor, and both a gate region and a second region of the first compensation transistor is coupled to the second compensation capacitor. Regulators of the present disclosure also include load voltage output control circuitry for regulating the load voltage output from the regulator. Adaptive biasing circuitry is included to control operation of the voltage output control circuitry. Sensing circuitry is also included which may act to vary the time constant of the adaptive compensation circuitry.

The load voltage output control circuitry includes a pass transistor which acts to vary the load voltage output from the regulator in dependence on a voltage at its gate region. The adaptive biasing circuitry includes a biasing transistor which acts to vary the voltage at the gate region of the pass transistor in dependence on the voltage at its own gate region. If a larger voltage is applied to the gate region of the biasing transistor, more current will flow through the biasing transistor and away from the pass transistor, thereby reducing the voltage at the gate region of the pass transistor. In turn, this will cause more current to flow through the pass transistor, thereby to increase the load voltage output from the regulator.

The adaptive biasing circuitry includes a voltage controlled current source, such as transconductance operational amplifier circuitry. The voltage controlled current source is arranged to receive the load voltage, and to control the current flow through the voltage controlled current source in dependence on this load voltage. As the load voltage increases, so will the current flow through the voltage controlled current source (and vice versa). The voltage controlled current source is coupled to the gate region of the biasing transistor so that the voltage at the gate region of the biasing transistor will depend on the flow of current through the voltage controlled current source, and thus on the load voltage. As more current flows through the voltage controlled current source (in response to the load voltage increasing), the voltage applied to the gate region of the biasing transistor will decrease, thereby causing the voltage applied to the gate region of the pass transistor to decrease and thus the load voltage output also to decrease.

The sensing circuitry includes is arranged to control current flow through the adaptive compensation circuitry. The sensing circuitry includes a sense transistor having a gate region coupled to the gate region of the pass transistor. The amount of current flowing through the sense transistor will therefore correspond to that flowing through the pass transistor. The sensing circuitry is arranged to vary current flow through the adaptive compensation circuitry in dependence on this current flow through the sense transistor.

The adaptive compensation circuitry is arranged to be coupled to the adaptive biasing circuitry and the sensing circuitry. The first compensation capacitor is coupled to the voltage controlled current source and the gate region of the biasing transistor. The second compensation capacitor is coupled to a first region of the biasing transistor. The second compensation capacitor and both the second and gate regions of the first compensation transistor are coupled to the sensing circuitry. Operation of the sensing circuitry to control the current flow through the adaptive compensation circuitry will in turn influence current flow to the biasing transistor, thereby to vary the load voltage output from the regulator.

This arrangement with the adaptive compensation circuitry providing a variable time constant for the regulator enables a good phase margin to be achieved across all operating conditions for the regulator. The adaptive compensation circuitry with split capacitors provides tracking for its associated zero without compromising DC operation of the regulator, as the regulator is configured to provide suitable output pole tracking using the load voltage output control circuitry and adaptive biasing circuitry. Embodiments may therefore provide a more stable low dropout regulator.

Specific Description

One example of a low dropout regulator will now be described with reference to FIG. 1. The functionality and operation of such a low dropout regulator will then be described with reference to FIG. 2, and additional and alternative features of such a low dropout regulator will later be described with reference to FIG. 3.

FIG. 1 shows a low dropout regulator 100. The regulator 100 comprises adaptive compensation circuitry 130, which includes a first compensation capacitor 131, a second compensation capacitor 132, a first compensation transistor 133, a compensation resistor 134, and a second compensation transistor 135.

The regulator 100 includes a supply voltage connection 101 for receiving a supply voltage $V_{DD}$. The regulator 100 also includes load voltage output control circuitry 110, which includes a load voltage output connection 112, a pass transistor 111, a third compensation capacitor 113, an output capacitor 114 and a load coupling port 115. A load 116 is also shown in FIG. 1. The regulator 100 also includes a first resistor 170.

The regulator 100 includes sensing circuitry 140, which comprises a sense transistor 141, and a first current mirror 145. The first current mirror 145 comprises a first mirroring transistor 146 and a first mirrored transistor 147.

The regulator 100 comprises adaptive biasing circuitry. The adaptive biasing circuitry includes a voltage controlled current source shown as operational transconductance amplifier ('OTA') circuitry 120. The OTA circuitry 120 includes a first OTA transistor 121, a second OTA transistor 122 and a tail transistor 125. The adaptive biasing circuitry also includes a biasing transistor 150 and a current buffer 160. The current buffer 160 includes a first transistor 161 and a second transistor 162. The adaptive biasing circuitry also includes a second current mirror 180, which includes a second mirroring transistor 181 and a second mirrored transistor 182. The adaptive biasing circuitry also comprises a controlled current source 190 comprising a first transistor 191 and a second transistor 192.

In the regulator 100 of FIG. 1, each of the transistors is a field effect transistor, such as a metal oxide semiconductor field effect transistor. All of the transistors in FIG. 1 have a source connection (identified by the arrow) for connection to a source region of the transistor, a drain connection for connection to a drain region of the transistor, and a gate connection (between the source and drain connections) for connection to a gate region of the transistor. N-channel transistors of FIG. 1 are shown with the arrow of the source connection directed away from their gate region, and P-channel transistors of FIG. 1 are shown with the arrow of the source connection directed towards their gate region. Connections between conductors are shown by black circles.

In the circuit shown in FIG. 1, a voltage is provided to the circuit in three regions. These three voltages are the supply voltage $V_{DD}$, a reference voltage $V_{ref}$ and a bias voltage $VN_{bias}$. The supply voltage $V_{DD}$ may be received from a DC power source, such as a battery. The supply voltage $V_{DD}$ is provided to components of the circuit via the supply voltage connection 101, which is coupled to the first resistor 170 and the source region of each of: the first and second transistors 191, 192 of the controlled current source 190, the second compensation transistor 135, the sense transistor 141 and the pass transistor 111. A gate connection of the first OTA transistor 121 is arranged to receive the reference voltage. A gate connection of the tail transistor 125 is arranged to receive the bias voltage.

The first OTA transistor 121 and the second OTA transistor 122 are N-channel transistors. The drain region of each of the first and second OTA transistors is respectively coupled to the supply voltage connection 101 via one of the transistors 191, 192 of the controlled current source. The source region of the first OTA transistor 121 is coupled to the source region of the second OTA transistor 122. A connection between the two OTA transistor source regions is coupled to the drain region of the tail transistor 125. A source region of the tail transistor 125 is coupled to ground.

The first OTA transistor 121 is coupled to the supply voltage connection 101 via the first transistor 191 of the controlled current source 190. The drain region of the first OTA transistor 121 is coupled to the drain region of the first transistor 191 of the controlled current source 190. The first transistor 191 and the second transistor 192 of the controlled current source 190 are both P-channel transistors. The source region of the first transistor 191 of the controlled current source 190 is coupled to the supply voltage connection 101, as is the source region of the second transistor 192 of the controlled current source 190. The gate region of the first transistor 191 of the controlled current source 190 is coupled to the gate region of the second transistor 192 of the controlled current source 190. The second OTA transistor 122 is coupled to the supply voltage connection 101 of the controlled current source 190 via the second transistor 192 of the controlled current source 190. The drain region of the second OTA transistor 122 is coupled to the drain region of the second transistor 192 of the controlled current source 190.

The first transistor 191 of the controlled current source 190 is also coupled to the current buffer 160. Specifically, the drain region of the first transistor 191 of the controlled current source 190 is coupled to the source region of the second transistor 162 of the current buffer 160. The first transistor 161 and the second transistor 162 of the current buffer 160 are both P-channel transistors. As the first transistor 191 of the controlled current source 190 is also coupled to the first OTA transistor 121, the connection between the first OTA transistor 121 and the first transistor 191 of the controlled current source 190 is coupled to the second transistor 162 of the current buffer 160. In other words, there is a conduction path from the drain region of the first transistor 191 of the controlled current source 190 that splits between one path to the drain region of the first OTA transistor 121 and one path to the source region of the second transistor 162 of the current mirror.

The second transistor 192 of the controlled current source 190 is also coupled to each of the current buffer 160, the compensation circuitry 130, and the OTA circuitry 120. Specifically, the drain region of the second transistor 192 of the controlled current source 190 is coupled to a first electrode of the first compensation capacitor 131, to the source region of first transistor 161 of the current buffer 160, and to the drain region of the second OTA transistor 122. In other words, there is a conduction path from the drain region of the second transistor 192 of the controlled current source 190 that splits between a first path to the first electrode of the first compensation capacitor 131, a second path to the drain region of the second OTA transistor 122, and a third path to the source region of the first transistor 161 of the current buffer 160.

The first transistor 161 of the current buffer 160 is also coupled to each of the biasing transistor 150 and the second current mirror 180. Specifically, the drain region of the first transistor 161 of the current buffer 160 is coupled both to the drain region of the second mirroring transistor 181 and to the gate region of the biasing transistor 150. The second mirroring transistor 181 and the second mirrored transistor 182 are both N-channel transistors. The biasing transistor 150 is an N-channel transistor.

The second transistor 162 of the current buffer 160 is also coupled to each of the third compensation capacitor 113 and the second current mirror 180. Specifically, the drain region of the second transistor 162 of the current buffer 160 is coupled both to the first electrode of the third compensation capacitor 113 and to the drain region of the second mirrored transistor 182 of the second current mirror 180. The gate and drain regions of the second mirrored transistor 182 are shorted in the manner of a diode connected transistor. The gate region of the second mirrored transistor 182 and the gate region of the second mirroring transistor 181 are also interconnected. Thus there is a connection between the second transistor 162 of the current buffer 160, the third compensation capacitor 113, both the gate region and the drain region of the second mirrored transistor 182, and the gate region of the second mirroring transistor 181. The source region of each of the second mirrored transistor 182 and the second mirroring transistor 181 is respectively coupled to ground.

The adaptive compensation circuitry 130 is coupled to the supply voltage connection 101. Specifically, the source region of the second compensation transistor 135 is coupled to the supply voltage connection 101. The second compensation transistor 135 comprises a P-channel transistor with its gate region shorted to its drain region. The second electrode of the first compensation capacitor 131 is coupled to the connection between the gate and drain region of the second compensation transistor 135. The first compensation transistor 133 comprises a P-channel transistor. The drain and gate regions of the second compensation transistor 135 and a second electrode of the first compensation capacitor 131 are coupled to the source region of the first compensation transistor 133. The gate region and the drain region of the first compensation transistor 133 are coupled to one another (e.g. they are diode-coupled). The second and gate regions of the first compensation transistor 133 are also coupled to a first electrode of the second compensation capacitor 132. The first and second compensation capacitors thus, in effect, represent a combined compensation capacitor that is split across the first compensation transistor 133.

The gate and drain regions of the first compensation transistor 133 are also coupled to the drain region of the first mirroring transistor 146. The first mirroring transistor 146 and the first mirrored transistor 147 of the first current mirror 145 are both N-channel transistors. The second electrode of the second compensation capacitor 132 is coupled to the compensation resistor 134.

The biasing transistor 150 is coupled to the supply voltage connection 101 via the first resistor 170. Specifically, the drain region of the biasing transistor 150 is coupled to each of the compensation resistor 134, the gate region of the sense transistor 141, the gate region of the pass transistor 111, and the first resistor 170. The pass transistor 111 and the sense transistor 141 are both P-channel transistors, for example the two may be same (e.g. they may have the same width to length ratio). The supply voltage connection 101 is coupled to the gate region of the pass transistor 111 and the gate region of the sense transistor 141 via the first resistor 170. In other words, there is a conduction path from the supply voltage connection 101 through the first resistor 170, where that path splits into paths directed to the respective gate region of each of the sense transistor 141 and the pass transistor 111, as well as paths to the drain region of the biasing transistor 150 and the compensation resistor 134. The source region of the biasing transistor 150 is coupled to ground.

The source region of the sense transistor 141 is coupled to the supply voltage connection 101.

The gate region of the sense transistor 141 is coupled to the gate region of the pass transistor 111. The sense transistor 141 is coupled to the first current mirror 145. The drain region of the sense transistor 141 is coupled to the drain and gate regions of the first mirrored transistor 147 of the first current mirror 145 (the gate and drain regions of the first mirrored transistor 147 are diode-shorted). The gate region of the first mirrored transistor 147 and the first mirroring transistor 146 are interconnected. The source region of each of the first mirrored transistor 147 and the first mirroring transistor 146 is coupled to ground.

The source region of the pass transistor 111 is coupled to the supply voltage connection 101. The drain region of the pass transistor 111 is also coupled to the load output voltage connection. The load voltage output connection 112 is coupled to the second electrode of the third compensation capacitor 113, the first electrode of the output capacitor 114 and the load 116. The output capacitor 114 is connected in parallel with the load 116. The voltage output connection 112 is coupled to the load 116 via the coupling port 115. The second electrode of the output capacitor 114 is coupled to ground. In the example shown in FIG. 1, the second electrode of the output capacitor 114 is coupled to an output from the load 116, and the connection between the two is coupled to ground. Although not shown explicitly in FIG. 1, a coupling is provided between the gate region of the second OTA transistor 122 and the load voltage output connection 112 for the second OTA transistor 122 to receive the load voltage, or an indication thereof.

The controlled current source 190 is configured to configured to receive the supply voltage $V_{DD}$ and provide a controlled current output. The transistors 191, 192 of the controlled current source 190 are gate-coupled to provide consistent current output. The two transistors of the controlled current source 190 may be the same, so that current output from the drain region of each of the transistors is the same. The regulator 100 is arranged to enable a current output from the first transistor 191 of the controlled current source 190 to flow to each of the first OTA transistor 121 and the second transistor 162 of the current buffer 160. The regulator 100 is arranged to enable a current output from the second transistor 192 of the controlled current source 190 to flow to each of the first compensation capacitor 131, the second OTA transistor 122 and the first transistor 161 of the current buffer 160.

The reference voltage applied to the first OTA transistor 121 may be a constant, e.g. so that the amount of current drawn by the first OTA transistor 121 remains constant. The first OTA resistor is configured to draw an amount of current through its drain region which is proportional to the reference voltage applied to its gate region. Likewise, the second OTA resistor is configured to draw an amount of current through its drain region which is proportional to the voltage applied to its gate region, i.e. proportional to the load voltage. The second OTA resistor is configured to draw more current through its gate region in the event that the load voltage increases, and to draw less current in the event that the load voltage decreases. The regulator 100 is thus arranged so that the flow of current between the second transistor 192 of the controlled current source 190 and the first electrode of the first compensation capacitor 131 and the second transistor 162 of the current buffer 160 will vary in dependence on the load voltage. In particular, the regulator 100 is arranged so that the flow of current from the second transistor 192 of the controlled current source 190 to the gate region of the biasing transistor 150 will vary in dependence on the current flow through the second OTA transistor 122 (and thus in dependence on the load voltage). The tail transistor 125 may receive a constant bias voltage, e.g. to provide a consistent current output (to ground).

The current buffer 160 is arranged as a common gate current buffer 160 (the gates of the two transistors of the current buffer 160 are coupled to one another). The current buffer 160 is arranged to inhibit the components coupled to the output of the current buffer 160 (e.g. the second current mirror 180, the third compensation capacitor 113 and/or the biasing transistor 150) from interfering with operation of the components coupled to the input to the current buffer 160 (e.g. to prevent the output loading the input). The current buffer 160 may therefore be configured to inhibit current flow to the third compensation capacitor 113/biasing transistor 150 from interfering with current flow to the first OTA transistor 121/second OTA transistor 122.

The voltage at the gate region of the biasing transistor 150 will depend on the amount of current drawn through the second OTA transistor 122. In other words, the regulator 100 is arranged so that the voltage at the gate region of the biasing transistor 150 will vary in dependence on the load voltage. For example, the regulator 100 is arranged so that, in the event that the load voltage increases, the voltage provided to the gate region of the biasing transistor 150 will decrease, and in the event that the load voltage decreases, the voltage provided to the gate region of the biasing transistor 150 will increase.

The second current mirror 180 is configured so that the output current from the second mirroring transistor 181 (e.g. from its source region) will correspond to the output current from the second mirrored transistor 182. For example, the two transistors of the second current mirror 180 may be the same (e.g. they may have the same width to length ratios). The amount of current directed towards the gate region of the biasing transistor 150 from the first transistor 161 of the current buffer 160 will therefore also depend on the amount of current passing through the second mirrored transistor 182. This is because the amount of current flowing from the first transistor 161 of the current buffer 160 to the second mirroring transistor 181 will correspond to the amount of current flowing through the second mirrored transistor 182. The amount of current flowing through the second mirrored transistor 182 will also depend on the amount of current flowing to/from the first electrode of the third compensation capacitor 113.

The second compensation transistor 135 is configured to provide a one-way conduction path from the supply voltage connection 101 to the source region of the first compensation transistor 133 and the second electrode of the first compensation capacitor 131. The adaptive compensation circuitry 130 is arranged so that a current provided to the source region of the first compensation transistor 133 varies in dependence on the supply voltage $V_{DD}$, and a charge on the first compensation capacitor 131. For example, in the event that the first compensation capacitor 131 is charging, i.e. its first electrode is accumulating negative charge, the current flow to the first compensation transistor 133 may increase, and/or in the event that the first compensation capacitor 131 is discharging, the current flow to the first compensation transistor 133 may decrease.

The first compensation transistor 133 is configured to provide a conduction path to each of the second compensation capacitor 132 and the first mirroring transistor 146 of the first current mirror 145. The second compensation capacitor 132 is arranged to charge/discharge in dependence on the operating state of the mirroring transistor. In the event that the current flow through the first mirroring transistor 146 increases, the second compensation capacitor 132 will charge at a slower rate or begin to discharge/discharge at a quicker rate, as more current will be drawn to the first mirroring transistor 146 than to the first electrode of the second compensation capacitor 132. In the event the current flow through the first mirroring transistor 146 decreases, the first electrode of the second compensation capacitor 132 will accumulate more charge or lose charge at a slower rate. The magnitude and direction of current flow across the compensation resistor 134 will depend on the state of the second compensation capacitor 132, and thus on the operational state of the first mirroring transistor 146.

The compensation circuitry 130 is arranged to provide split capacitors. The compensation circuitry 130 is arranged so that the split capacitors effectively act in series without effecting the DC operating conditions of the regulator 100. The compensation circuitry 130 is arranged to compensate the output pole (wp2) for the regulator transfer function with the zero (wz2) for the regulator transfer function. The compensation circuitry 130 may be arranged to provide a variable time constant.

The first resistor 170 is arranged to provide a voltage drop between the supply voltage $V_{DD}$ and the voltage provided to the gate region of each of the sense transistor 141 and the pass transistor 111.

The sensing circuitry 140 is configured to regulate current flow away from the first compensation transistor 133 and the first plate of the second compensation capacitor 132 through the first current mirror 145. The sense transistor 141 is configured to control current flow from the supply voltage connection 101 through the first current mirror 145 based on the voltage applied to its gate region. The sense transistor 141 is configured so that, in the event that the voltage applied to the gate region of the sense transistor 141 increases, the current flow through the sense transistor 141 to first current mirror 145 decreases, and that, in the event that the voltage applied to its gate region decreases, said current flow increases. The sense transistor 141 is configured to receive the supply voltage $V_{DD}$ (e.g. at its source connection) and to selectively throughput current based on the voltage at its gate region. The sense transistor 141 provides a selective conduction path between the supply voltage connection 101 and the first current mirror 145.

The first current mirror 145 is arranged so that the current flow from the first mirroring transistor 146 corresponds to that from the first mirrored transistor 147. The first mirroring transistor 146 may be the same as the first mirrored transistor 147 (e.g. have the same width to length ratio), and the current flow from each may be identical. The first mirrored transistor 147 is diode shorted so that a current passing through the sense transistor 141 to the first current mirror 145 passes through the first mirrored transistor 147 to ground. A corresponding (or identical, if the two transistors are the same) current will then flow out through the first mirroring transistor 146. The current flow through the first mirroring transistor 146 is configured to reflect the current from the sense transistor 141, e.g. in the event that the current flowing through the sense transistor 141 increases, the current flowing through the first mirroring transistor 146 will also increase. The first mirroring transistor 146 is configured to draw this current from the first compensation transistor 133, e.g. so that as the current flowing through the sense transistor 141 increases, more current is drawn from the drain region of the first compensation transistor 133 (and optionally from the first electrode of the second compensation capacitor 132, or less current may be delivered to said first electrode from the first compensation transistor 133).

The regulator 100 is arranged so that current flow away from the first compensation transistor 133 and the first plate of the second compensation capacitor 132 is dependent on voltage applied to the gate region of the sense transistor 141. The voltage applied to the gate region of the sense transistor 141 will correspond to (e.g. it may be the same as) the voltage applied to the gate region of the pass transistor 111. The regulator 100 is arranged so that the voltage applied to these gate regions is dependent on the operational state of the adaptive compensation circuitry 130, and the operational state of the biasing transistor 150. Current may flow towards or away from the connection to the adaptive compensation circuitry 130. The magnitude and direction of this current flow will vary in dependence on the state of the second compensation capacitor 132 (e.g. whether it is charging, charged, or discharging), which may vary in dependence on a magnitude of current flow through the first mirroring transistor 146.

A magnitude of current flowing through the biasing transistor 150 will vary in dependence on the voltage applied to its gate region. The regulator 100 is arranged so that the output from both the sense and pass transistors will vary in dependence on the voltage applied to the gate region of the biasing transistor 150. The voltage applied to the gate region of the biasing transistor 150 will vary in dependence on operation of the second OTA transistor 122 (how much current it is drawing), and this operation of the second OTA transistor 122 will vary on the load voltage. The regulator 100 is thus configured to regulate the output of the pass transistor 111 (and thus the load voltage) based on the load voltage. For example, the regulator 100 is configured so that, as the load voltage increases, or begins to increase, this increase causes the pass transistor 111 to pass less current, and thus decrease (or prevent increase) in the load voltage. Likewise, as the load voltage decreases, or begins to decrease, this decrease causes the pass transistor 111 to pass more current, and thus increase (or prevent decrease) in the load voltage.

The pass transistor 111 provides a selective conduction path between the supply voltage connection 101 and the load voltage output connection 112. Conduction through this path from the supply voltage connection 101 to the load voltage output connection 112 will vary in dependence on the voltage at the gate region of the pass transistor 111 (and thus in dependence on the operational states of the biasing transistor 150 and/or the adaptive compensation circuitry 130). As the voltage at the gate region of the pass transistor 111 increases, the pass transistor 111 will draw less current, and as the voltage at the gate region decreases, the pass transistor 111 will draw more current.

The load coupling port 115 is configured to provide a coupling for a load 116. In some examples, the load 116 may be included as part of the regulator circuitry, in which case the load coupling port 115 may effectively comprise a conductor which is coupled to an input for the load 116. In other examples, the load 116 may be a separate component to the regulator circuitry, in which case the coupling port 115 may comprise an electrical coupling to enable a load 116 to be coupled to the regulator 100 to receive the load voltage therefrom. The load coupling port 115 is arranged to deliver load voltage to the load 116. The load voltage output control circuitry 70 is configured to provide a regulated load voltage to the load 116. Charge on the second electrode of the third compensation capacitor 113 (and thus current flow to/from the second electrode) will vary in dependence on charge provided to the first electrode of the third compensation capacitor 113.

It is to be appreciated in the context of the present disclosure that features of the regulator 100 may be selected to provide a selected value for the load voltage. For example, transistors, resistors and/or capacitors of the circuit may be selected to provide the relevant operational characteristics which give the load voltage its intended value. A capacitance value for one or more of the capacitors may be selected based on the pole compensation for which that capacitor is intended. For example, capacitance values for each of the first and second compensation capacitors, and the third compensation capacitor 113 (and a resistance for the compensation resistor 134) may be selected to provide stability for the regulator 100 over the load current range.

Exemplary regulator 100 functionality will now be described with reference to FIG. 2.

Figure 2:
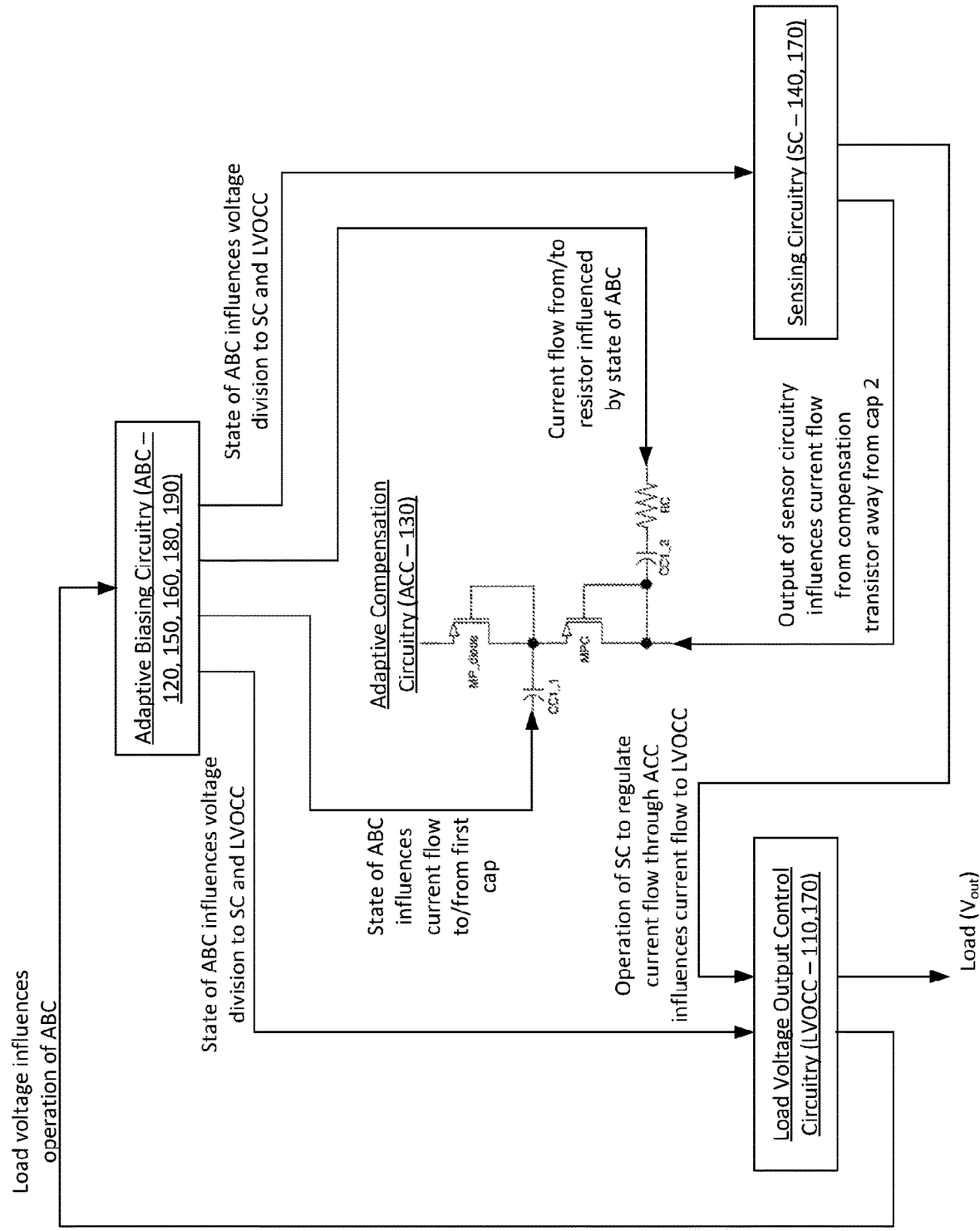
FIG. 2 shows a schematic diagram to illustrate the relationship between different components of an exemplary low dropout regulator.

FIG. 2 shows a block diagram illustrating the functional relationship between different components of the regulator 100. For each component of the diagram shown in FIG. 2, an arrow out of (e.g. away from) a component indicates an output. An arrow into a component indicates an input, e.g.

indicates that the output of the component to which the arrow is directed may be influenced by this input.

FIG. 2 illustrates adaptive biasing circuitry ('ABC'—e.g. as provided by the OTA circuitry 120, biasing transistor 150, current buffer 160, second current mirror 180 and controlled current source 190 of the regulator 100 of FIG. 1), adaptive compensation circuitry ('ACC'—e.g. as provided by the compensation circuitry 130 of the regulator 100 of FIG. 1), a load voltage output control circuitry ('LVOCC'—e.g. as provided by the output control circuitry 110 and the first resistor 170 of the regulator 100 of FIG. 1), and sensing circuitry ('SC'—e.g. as provided by the sensing circuitry 140 and first resistor 170 of the regulator 100 of FIG. 1).

Although not shown in FIG. 2, a supply voltage $V_{DD}$ is provided to the components shown in FIG. 2 (e.g. as provided by the supply voltage connection 101 of the regulator 100 of FIG. 1). This supply voltage $V_{DD}$ may be provided to each of the ABC, the ACC, the LVOCC, and the SC. Operation of each of these components will depend, at least in part, on the supply voltage.

Additionally, as will be appreciated, operation of each of these components will depend also on operation of other components of the regulator 100.

The ABC (in particular the OTA circuitry 120) also receives the load voltage as an input. The output from the OTA circuitry (the current flow through the second OTA transistor 122) will depend on the load voltage it receives, and thus operation of the ABC will depend on the load voltage. This operation of the ABC will influence the current flow to/from the first compensation capacitor 131 of the ACC (as indicated by the arrow in FIG. 2). Additionally, the current flow through the second OTA transistor 132 of the ABC will influence the voltage applied to the gate region of the biasing transistor 150 of the ABC. The voltage applied to the gate region of the biasing transistor 150 will influence the current flow to/from the compensation resistor 134 (as indicated by the arrow in FIG. 2). The voltage applied to the gate region of the biasing transistor 150 will also influence operation of the SC and the LVOCC (as indicated by the two arrows in FIG. 2). This is because the voltage applied to the gate region of the biasing transistor 150 will influence the voltage applied to the gate region of the sense transistor 141 of the SC 140 and the voltage applied to the gate region of the pass transistor 111 of the LVOCC 110.

In particular, if the load voltage increases, the second OTA transistor 122 of the ABC will draw more current. Less current will be directed towards the first compensation capacitor 131, and the gate voltage for the biasing transistor 150 will decrease. In turn, this will decrease current flow through the biasing transistor 150, and thus increase the voltage applied to the gate region of each of the sense transistor 141 and the pass transistor 111.

Operation of the SC will influence operation of the ACC. In particular, the SC will influence the magnitude of current flow away from the first compensation transistor 133 and the second compensation capacitor 132 (as indicated by the arrow shown in FIG. 2). As more current passes through the sense transistor 141 of the SC (e.g. in response to the gate voltage for the sense transistor 141 decreasing), the SC will cause more current to flow away from the first compensation transistor 133 and the second compensation capacitor 132. In turn, this will influence the current flow to/from the second electrode of the second compensation capacitor 132 via the compensation resistor 134 (and thus also the voltage provided to the gate region of each of the sense transistor 141 and the pass transistor 111). As such, operation of the SC will influence the operation of the LVOCC (as indicated by the arrow in FIG. 2).

Operation of the SC will therefore influence the current flow away from the drain region of the first compensation transistor 133. Operation of the ABC will influence the current flow to/away from the first compensation capacitor 131 and the compensation resistor 134. Based on these inputs to the ACC, the charge stored on the two capacitors will vary. The two capacitors act as though in series, and so the total capacitance associated with the ACC will be that for two capacitors connected in series. The first compensation transistor 133 acts to provide variable resistance in dependence on operation of the second compensation capacitor 132. A voltage associated with the ACC will then influence the voltage applied to the gate region of each of the sense transistor 141 and the pass transistor 111.

To further illustrate the functionality of the regulator 100, a few examples of its operation will now be described with reference to FIG. 1. It is to be appreciated in the context of the present disclosure that the low dropout regulator 100 is self-regulating. The following examples of operation are described as a sequence of events, but it will be appreciated that in practice these events occur simultaneously as the regulator 100 self-regulates.

The regulator 100 is configured to provide a consistent voltage output. Therefore, examples will be described for how the regulator 100 reacts in response to the load voltage output increasing and decreasing. These examples refer to changes in $V_{DD}$ causing the output voltage to increase/decrease. It will be appreciated that there are a plurality of connections to the supply voltage connection 101. As such, an increase, or decrease, in the supply voltage $V_{DD}$ will influence a number of different components simultaneously. For simplicity however, the following description is written as though events occur sequentially, as this should help illustrate how the self-regulation occurs. It will also be appreciated that there may be other causes for the increase/decrease in the output voltage, such as in dependence on the load current being drawn by the load.

In the event that the supply voltage $V_{DD}$ increases, the voltage provided to the source region of each of the pass transistor 111 and the sense transistor 141 will also increase. The voltage provided to the first resistor 170 will also increase, as will the corresponding voltage drop across the first resistor 170. In turn, the increase to the voltage at the source region for each of the sense transistor 141 and the pass transistor 111 will increase more than the voltage at the respective gate region for each of the sense transistor 141 and pass transistor 111. Thus, the gate-source voltage for each of the pass transistor 111 and the sense transistor 141 will increase in negativity, and the output from each transistor will increase. This will give rise to an increase in the load voltage, and thus the gate voltage for the second OTA transistor 122. As such, current flow through the second OTA transistor 122 will increase, and cause the voltage at the gate region of the biasing transistor 150 to drop. Less current will then flow through the biasing transistor 150, thus causing the voltage at the gate region of each of the pass transistor 111 and the sense transistor 141 to increase relative to their respective source voltages, thereby to reduce the load voltage (e.g. back to its intended value).

It will also be appreciated that, during this regulation, the sensing circuitry 140 (including the first current mirror 145), the second current mirror 180 and the adaptive compensation circuitry 130 may also act to compensate operation of the regulator 100. The output from the sense transistor 141 will correspond to that from the pass transistor 111. As such the first current mirror 145 will output a greater current, and thus draw more current away from the drain region of the first compensation transistor 133 and the first electrode of the second compensation capacitor 132. This may cause the second compensation capacitor 132 to discharge and in turn influence voltage provided to the gate region of the sense transistor 141 and the pass transistor 111. In response to greater VD, the second compensation transistor 135 and/or first compensation capacitor 131 may operate to provide a greater input to the first compensation transistor 133 Also, operation of the third compensation capacitor 113 may also influence current flow through the second mirrored transistor 182. In turn, this will also influence the current flow through the second mirroring transistor 181, and thus the voltage at the gate region of the biasing transistor 150.

In the event that the supply voltage $V_{DD}$ decreases, the situation will be opposite to that described above. That is, the load voltage may decrease, which in turn will cause the current flow through the second OTA transistor 122 to decrease. As such, a voltage at the gate region of the biasing transistor 150 will be higher, and more current will flow through said biasing transistor 150. In turn, this will cause a reduction in gate voltage for the sense and pass transistors relative to their source voltages, and thus an increase in the load voltage.

Embodiments may provide improved low dropout regulators. In particular, embodiments may provide low dropout regulators with improved stability (e.g. good phase margins across all operating conditions). This may be apparent with reference to the poles and zeros for the regulator. In particular, the output pole (wp2) may be compensated with the zero (wz2). For instance, the equations for wp2 and wz2 may be derived to be:

$$wp2 = \frac{CC2 * gm_L}{(CC1\_1 \| CC1\_2) * Co},$$

$$\text{and } wz2 = \frac{1}{(CC1\_1 \| CC1\_2) * \left(Rc + \left(\frac{1}{gm_{MPC}}\right) + \left(\frac{1}{gm_{MPP_{cas}}}\right)\right)}$$

$$\text{where } CC1\_1 \| CC1\_2 = \frac{CC1\_1 * CC1\_2}{(CC1\_1 + CC1\_2)}$$

From above wp2 equation $gm_L$ varies with load current, and in wz2 equation $gm_{MPC}$ varies with load, while all other parameters are constant in both equations with load current. Thus, by controlling CC2, (CC1_1∥CC1_2) and RC, as in the regulator 100 described above, the regulator 100 may be stable over the entire load current range. Splitting the compensation capacitor to achieve this (CC1_1 and CC1_2), the DC operating conditions of the regulator 100 may not be affected, while still providing this increased stability. The provision of a current buffer 160 may inhibit presence of a feedforward path, which may enable the zero to be converted from a right half plane zero to a left half plane zero (e.g. to facilitate cancelling the pole). Additionally, or alternatively, the inclusion of the first compensation transistor 133 may facilitate with this conversion of the zero to a left half plane zero.

Additional and/or alternative features for a low dropout regulator will now be described with reference to FIG. 3.

Figure 3:
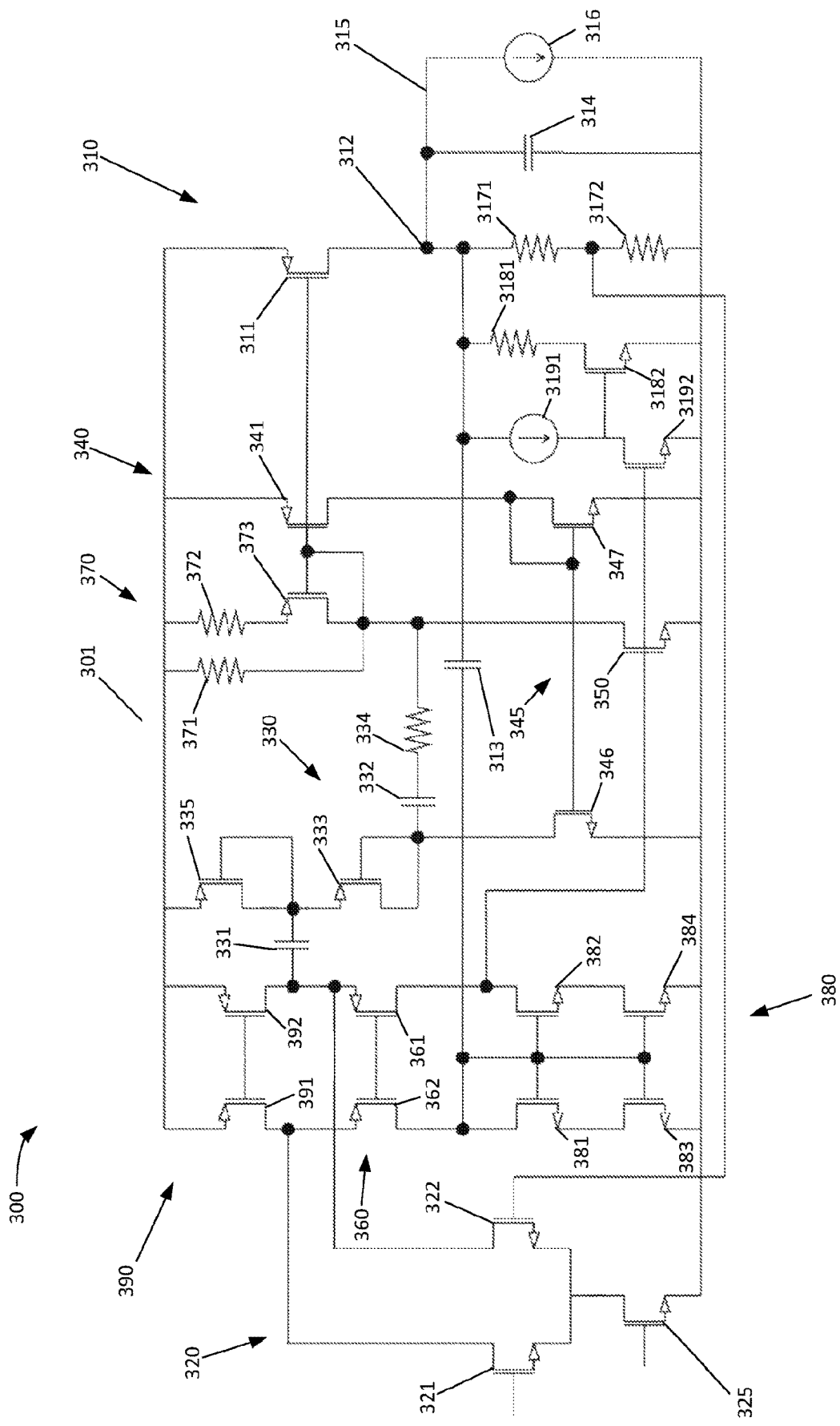
FIG. 3 shows a schematic circuit diagram for an exemplary low dropout regulator.

The arrangement of FIG. 3 is similar to that of FIG. 1, with like reference numerals indicating like elements, and these like elements will not be described again. Instead, the following description will focus on features of the arrangement of FIG. 3 which differ from the regulator 100 of FIG. 1.

FIG. 3 shows a regulator 300. In addition to the components described above for the regulator 100 of FIG. 1, the regulator 300 of FIG. 3 includes resistance assembly 370 comprising a drain resistor 371, a source resistor 372, and a resistance transistor 373. Also shown in the regulator 300 of FIG. 3 which differs to the regulator 100 of FIG. 1 is second current mirror assembly 380 and load voltage output control circuitry 310. The current mirror assembly 380 comprises a first transistor 381, a second transistor 382, a third transistor 383 and a fourth transistor 384. The output control circuitry comprises a first output resistor 3171, a second output resistor 3172, a third output resistor 3181, a first output transistor 3182, a current source 3191 and a second output transistor 3192.

The resistance assembly 370 is arranged in place of the first resistor 170 from the regulator 100 of FIG. 1. The resistance transistor 373 is coupled to each of the supply voltage connection 301, the sense transistor 341, the pass transistor 311, the adaptive compensation circuitry 330, and the biasing transistor 350. The resistance transistor 373 is a P-channel transistor. The gate region of the resistance transistor is coupled to the gate region of the sense transistor 341 and to the gate region of the pass transistor 311. The source region of the resistance transistor 373 is coupled to the supply voltage connection 301. The drain region of the resistance transistor 373 is coupled to the compensation resistor 334 (and thus the second electrode of the second compensation capacitor 332), and the drain region of the biasing transistor 350. Additionally, the drain region of the resistance transistor 373 is also coupled to the supply voltage connection 301. The source region of the resistance transistor 373 is coupled to the supply voltage connection 301 via the source resistor 372 and the drain region of the resistance transistor 373 is coupled to the supply voltage connection 301 via the drain resistor 371. The drain and gate regions of the resistance transistor 373 are coupled (to provide a diode-shorted transistor).

The gate region of the pass transistor 311 and the gate region of the sense transistor 341 are both coupled to the supply voltage input connection 301 via the resistance transistor 373. Specifically, the respective gate regions of the sense and pass transistors 341, 311, are coupled to both the gate and drain regions of the resistance transistor 373, and wherein the source and drain regions of the resistance transistor 373 are coupled to the supply voltage connection. The drain region of the biasing transistor 350 and the compensation resistor 334 are both coupled to both the gate and drain regions of the resistance transistor 373 (and thus to the respective gate regions of the sense transistor 341 and the pass transistor 311).

The second current mirror assembly 380 comprises two more transistors than those used in the second current mirror 180 of the regulator 100 of FIG. 1. All of the transistors of the second current mirror assembly 380 are N-channel transistors. The second current mirror assembly 380 is coupled to the current buffer 360, the biasing transistor 350 and the third compensation capacitor 313. Specifically, a drain region of the first transistor 381 of the second current mirror assembly 380 is coupled to the drain region of the second transistor 362 of the current buffer 360 and the first electrode of the third compensation capacitor 313. A drain region of the second transistor 382 of the second current mirror assembly 380 is coupled to the drain region of the first transistor 361 of the current buffer 360 and to the gate region of the biasing transistor 350. The drain region of the second transistor 382 of the second current mirror assembly 380 may also be coupled to a gate region of the second output transistor 3192 (as shown in FIG. 3).

A gate region of the first transistor 381 of the second current mirror assembly 380 is coupled to a gate region of the second transistor 382 of the second current mirror assembly 380. A source region of the first transistor 381 of the second current mirror assembly 380 is coupled to a drain region of the third transistor 383 of the second current mirror assembly 380. A source region of the second transistor 382 of the second current mirror assembly 380 is coupled to a drain region of the fourth transistor 384 of the second current mirror assembly 380. A gate region of the third transistor 383 of the second current mirror assembly 380 is coupled to a gate region of the fourth transistor 384 of the second current mirror assembly 380. The gate regions of the first and second transistors 381, 382 of the second current mirror assembly 380 are both also coupled to the drain region of the first transistor 381 of the second current mirror assembly 380. The drain region of the first transistor 381 of the second current mirror assembly 380 may also be coupled to the respective gate regions of both the third and fourth transistor 383, 384 of the second current mirror assembly 380 (e.g. the gate regions of all four of the transistors of the second current mirror assembly 380 may be interconnected).

The load voltage output connection 312 is coupled to the load 316 (via the coupling port 315), and the output capacitor 314, which are arranged in parallel with each other. The load voltage output connection 312 is also coupled to the other components of voltage output control circuitry 310. For example, the load voltage output connection is coupled to the first output resistor 3171, and to the second output resistor 3172 via the first output resistor 3171. The load voltage output connection is coupled to the third output resistor 3181 and to first output transistor 3182 via the third output resistor 3181. The load voltage output connection is also coupled to the current source 3191 and to the second output transistor 3192 via the current source 3191. The first and second output transistors 3182, 3192 are each N-channel transistors. The load voltage output connection is coupled to a drain region of the first output transistor 3182 via the third resistor 3181. The drain region of the second output transistor 3192 is coupled to the load voltage output connection via the current source 3191, and also to the gate region of the first output transistor 3182. The source region of each output transistor is respectively coupled to ground.

Also, as can be seen in FIG. 3, the load voltage output connection 312 is coupled to the gate region of the second OTA transistor 322. Specifically, a connection is provided from between the first and second output resistors 3171 to the gate region of the second OTA transistor 322. The output control circuitry 310 may be arranged to scale the voltage provided to the second OTA transistor 322, e.g. by providing a potential divider so that the voltage provided to the second OTA transistor 322 is reduced relative to the load voltage. The amount of scaling (e.g. reduction) provided to the load voltage may be selected to control a maximum amount of variation in operating conditions for the regulator 300, e.g. to limit the maximum amount of change in voltage at the gate region of the pass transistor 311. For example, the values for the first and second output resistors 3171, 3172 may be selected accordingly.

It is to be appreciated in the context of the present disclosure that embodiments described herein are examples for low dropout regulators of the present disclosure. However, these examples are not to be considered limiting. For example, it will be appreciated that the particular arrangement of transistors (and their respective channel arrangements) need not be considered limiting. For example, a different arrangement of N/P-channel transistors may be used to provide the desired functionality, and/or different (e.g. non-FET) transistors may be used. Likewise, capacitors are shown with curly lines to indicate stacking on the circuit board (e.g. curly line is lower layer). However, other arrangements for these capacitors may be used. In some examples, sensing circuitry 140, and the feedback it enables, may instead be provided by the pass transistor 111 and output control circuitry 70. Alternatively, where the load voltage is used to regulate the second OTA transistor 122, this may instead be an indication of the load voltage, e.g. it may be from the output of the sense transistor 141.

In examples described herein, resistors have been illustrated and discussed. However, it is to be appreciated in the context of the present disclosure that one or more of these resistors may have an effective resistance of zero. For example, in FIG. 3, the first resistance 3171 and second resistance 3172 may act to scale the voltage provided to the gate region of the second OTA transistor 322. However, one or more of these resistors may provide no voltage drop (e.g. to control the scaling, or to provide unity scaling). Likewise, one or both of the drain resistor 371 and the source resistor 372 may have no resistance.

It will be appreciated from the discussion above that the examples shown in the figures are merely exemplary, and include features which may be generalised, removed or replaced as described herein and as set out in the claims. With reference to the drawings in general, it will be appreciated that schematic functional block diagrams are used to indicate functionality of systems and apparatus described herein. It will be appreciated however that the functionality need not be divided in this way, and should not be taken to imply any particular structure of hardware other than that described and claimed below. The function of one or more of the elements shown in the drawings may be further subdivided, and/or distributed throughout apparatus of the disclosure. In some examples the function of one or more elements shown in the drawings may be integrated into a single functional unit.

As will be appreciated by the skilled reader in the context of the present disclosure, each of the examples described herein may be implemented in a variety of different ways. Any feature of any aspects of the disclosure may be combined with any of the other aspects of the disclosure. For example, method aspects may be combined with apparatus aspects, and features described with reference to the operation of particular elements of apparatus may be provided in methods which do not use those particular types of apparatus. In addition, each of the features of each of the examples is intended to be separable from the features which it is described in combination with, unless it is expressly stated that some other feature is essential to its operation. Each of these separable features may of course be combined with any of the other features of the examples in which it is described, or with any of the other features or combination of features of any of the other examples described herein. Furthermore, equivalents and modifications not described above may also be employed without departing from the invention.

Other examples and variations of the disclosure will be apparent to the skilled addressee in the context of the present disclosure.

The invention claimed is:

1. A low dropout regulator comprising:
a supply voltage connection for receiving a supply voltage;
a load voltage output connection for providing a load voltage to a load;
load voltage output control circuitry comprising a pass transistor configured to regulate the load voltage based on a voltage at its gate region;
adaptive biasing circuitry comprising:
a biasing transistor configured to regulate the voltage provided to the gate region of the pass transistor based on a voltage provided to a gate region of the biasing transistor; and
operational transconductance amplifier, OTA, circuitry comprising a first OTA transistor and a second OTA transistor, wherein a gate region of the first OTA transistor is arranged to receive a reference voltage and a gate region of the second OTA transistor is arranged to receive a voltage indicative of the load voltage; and
adaptive compensation circuitry comprising: (i) a first compensation capacitor having a first electrode and a second electrode, (ii) a second compensation capacitor having a first electrode and a second electrode, and (iii) a first compensation transistor, wherein the second electrode of the first compensation capacitor is coupled to a first region of the first compensation transistor, and wherein the first electrode of the second compensation capacitor is coupled to both a second and a gate region of the first compensation transistor;
wherein a first region of the second OTA transistor is coupled to: (i) the supply voltage connection, (ii) the first electrode of the first compensation capacitor, and (iii) the gate region of the biasing transistor; and
wherein a second electrode of the second compensation capacitor is coupled to a first region of the biasing transistor.

2. The low dropout regulator of claim 1, wherein a first region of the pass transistor is coupled to the supply voltage connection and a second region of the pass transistor is coupled to the load voltage output connection.

3. The low dropout regulator of claim 2, further comprising sensing circuitry, wherein the sensing circuitry comprises a sense transistor having a gate region coupled to the gate region of the pass transistor and a first region coupled to the supply voltage connection.

4. The low dropout regulator of claim 3, wherein the sensing circuitry comprises a first current mirror coupled to both the sense transistor and the adaptive compensation circuitry.

5. The low dropout regulator of claim 4, wherein the first current mirror comprises a first mirroring transistor having a first region coupled to: (i) the first electrode of the second compensation capacitor, (ii) the gate region of the first compensation transistor, and (iii) the second region of the first compensation transistor.

6. The low dropout regulator of claim 5, wherein the first current mirror comprises a first mirrored transistor, and wherein the second region of the sense transistor is coupled to: (i) the first region of the first mirrored transistor, (ii) the gate region of the first mirrored transistor, and (iii) the gate region of the first mirroring transistor.

7. The low dropout regulator of claim 1, wherein the adaptive compensation circuitry comprises a second compensation transistor, and wherein the first region of the first compensation transistor is coupled to the supply voltage connection via the second compensation transistor.

8. The low dropout regulator of claim 7, wherein a first region of the second compensation transistor is coupled to the supply voltage connection and its second and gate regions are shorted and coupled to both the second electrode of the first compensation capacitor and the first region of the first compensation transistor.

9. The low dropout regulator of claim 1, wherein the adaptive compensation circuitry further comprises a compensation resistor arranged between the second electrode of the second compensation capacitor and the first region of the biasing transistor.

10. The low dropout regulator of claim 1, wherein the gate region of the pass transistor is coupled to the supply voltage connection via one or more resistors.

11. The low dropout regulator of claim 10, wherein the first region of the biasing transistor is coupled to the supply voltage connection via said one or more resistors.

12. The low dropout regulator of claim 10, wherein the regulator further comprises a resistance transistor having a gate region coupled to the gate region of the pass transistor and first and second regions coupled to the supply voltage connection, and wherein at least one of the first and second regions is coupled to the supply voltage connection via one of said one or more resistors.

13. The low dropout regulator of claim 1, wherein the adaptive biasing circuitry comprises a current buffer, and wherein the gate region of the biasing transistor is coupled to the supply voltage connection, the first electrode of the first compensation capacitor and the first region of the second OTA transistor via the current buffer.

14. The low dropout regulator of claim 13, wherein the current buffer comprises a first transistor having a first region coupled to: (i) the supply voltage connection, (ii) the first electrode of the first compensation capacitor, and (iii) the first region of the second OTA transistor, and a second region coupled to the gate region of the biasing transistor.

15. The low dropout regulator of claim 14, wherein the current buffer comprises a second transistor having a first region coupled to both the supply voltage connection and a first region of the first OTA transistor.

16. The low dropout regulator of claim 15, wherein the gate region of the first transistor of the current buffer is coupled to the gate region of the second transistor of the current buffer.

17. The low dropout regulator of claim 13, wherein the regulator comprises a second current mirror, and wherein the second current mirror is coupled to the current buffer and the gate region of the biasing transistor.

18. The low dropout regulator of claim 1, wherein the load voltage output connection is coupled to: (i) a coupling port for connection of the regulator to a load, and (ii) a first electrode of an output capacitor.

19. The low dropout regular or claim 1, wherein the regulator comprises a controlled current source arranged to couple the supply voltage connection to the first region of the first and second OTA transistors, the first electrode of the first compensation capacitor and the gate region of the biasing transistor.

20. An electrical circuit comprising a load and a low dropout regulator, wherein the regulator is coupled to the load and configured to regulate a load voltage provided to the load;
wherein the regulator comprises:
a voltage input connection for receiving a supply voltage;

load voltage output circuitry comprising a pass transistor comprising a first region, a second region and a gate region, wherein the second region of the pass transistor is coupled to the load, and wherein the pass transistor is configured to regulate the load voltage provided to the load based on a voltage at its gate region;

adaptive biasing circuitry comprising:
- a biasing transistor configured to regulate the voltage provided to the gate region of the pass transistor based on a voltage provided to a gate region of the biasing transistor; and
- operational transconductance amplifier, OTA, circuitry comprising a first OTA transistor and a second OTA transistor, wherein a gate region of the first OTA transistor is arranged to receive a reference voltage and a gate region of the second OTA transistor is arranged to receive a voltage indicative of the load voltage; and adaptive compensation circuitry comprising: (i) a first compensation capacitor having a first electrode and a second electrode, (ii) a second compensation capacitor having a first electrode and a second electrode, and (iii) a compensation transistor, wherein the second electrode of the first compensation capacitor is coupled to a first region of the compensation transistor, and wherein the first electrode of the second compensation capacitor is coupled to both a second region of the compensation transistor and a gate region of the compensation transistor;

wherein a first region of the second OTA transistor is coupled to: (i) the supply voltage connection, (ii) the first electrode of the first compensation capacitor, and (iii) the gate region of the biasing transistor; and wherein a second electrode of the second compensation capacitor is coupled to a first region of the biasing transistor.

* * * * *